United States Patent [19]

Fujii et al.

[11] Patent Number: 5,676,804
[45] Date of Patent: Oct. 14, 1997

[54] METHOD FOR FABRICATING FRESNEL LENSES BY SELECTIVE APPLICATION AND REMOVAL OF FILMS ON LENS SURFACES

[75] Inventors: Akiyoshi Fujii, Ikoma-gun; Hiroshi Hamada, Nara; Naoyuki Tanaka, Taki-gun, all of Japan

[73] Assignee: Sharp Kabushiki Kaisha, Osaka, Japan

[21] Appl. No.: 525,082

[22] Filed: Sep. 8, 1995

[30] Foreign Application Priority Data

Sep. 13, 1994 [JP] Japan .................. 6-219174
Aug. 7, 1995 [JP] Japan .................. 7-201069

[51] Int. Cl.[6] .................. C23C 14/00; C23C 14/32
[52] U.S. Cl. .................. 204/192.28; 204/192.14; 204/192.26; 427/448; 427/466; 427/468; 427/469; 427/472; 427/474; 427/526
[58] Field of Search .................. 427/448, 466, 427/468, 469, 472, 474, 526; 204/192.14, 192.28, 192.26

[56] References Cited

U.S. PATENT DOCUMENTS

| 3,542,453 | 11/1970 | Kantor | 359/565 |
| 4,670,095 | 6/1987 | Negishi | 156/655 |

FOREIGN PATENT DOCUMENTS

| 53-36250 | 4/1978 | Japan . |
| 56-111803 | 9/1981 | Japan . |
| 56-111804 | 9/1981 | Japan . |
| 4-36485 | 3/1992 | Japan . |
| 4-156528 | 5/1992 | Japan . |
| 4-248501 | 9/1992 | Japan . |
| 6-123801 | 5/1994 | Japan . |
| 6-250003 | 9/1994 | Japan . |

*Primary Examiner*—Donald E. Czaja
*Assistant Examiner*—Sean Vincent
*Attorney, Agent, or Firm*—Nixon & Vanderhye

[57] ABSTRACT

Particles of a lens coating material for forming a primary film are deposited from a direction toward which the surfaces of the lens prisms of a Fresnel lens face. Next, a light absorbing film is formed, conventionally, by sputtering, on both the lens surfaces on which the previously deposited primary film was formed and on the non-lens surfaces (on which no primary film was formed). This light absorbing film is intended to absorb types of undesirable or "invalid" light (e.g., "flaring light"). Subsequently, the films are removed from only the lens surfaces. Accordingly, a Fresnel lens having "invalid" light absorbing films only on the non-lens surfaces is more easily fabricated within a shorter time and at a reduced cost. Moreover, it is also possible to reduce the generation of "cone" and "rainbow" effects caused by "flaring light" when the Fresnel lens is used as a field lens of a projection-type image display device.

16 Claims, 6 Drawing Sheets

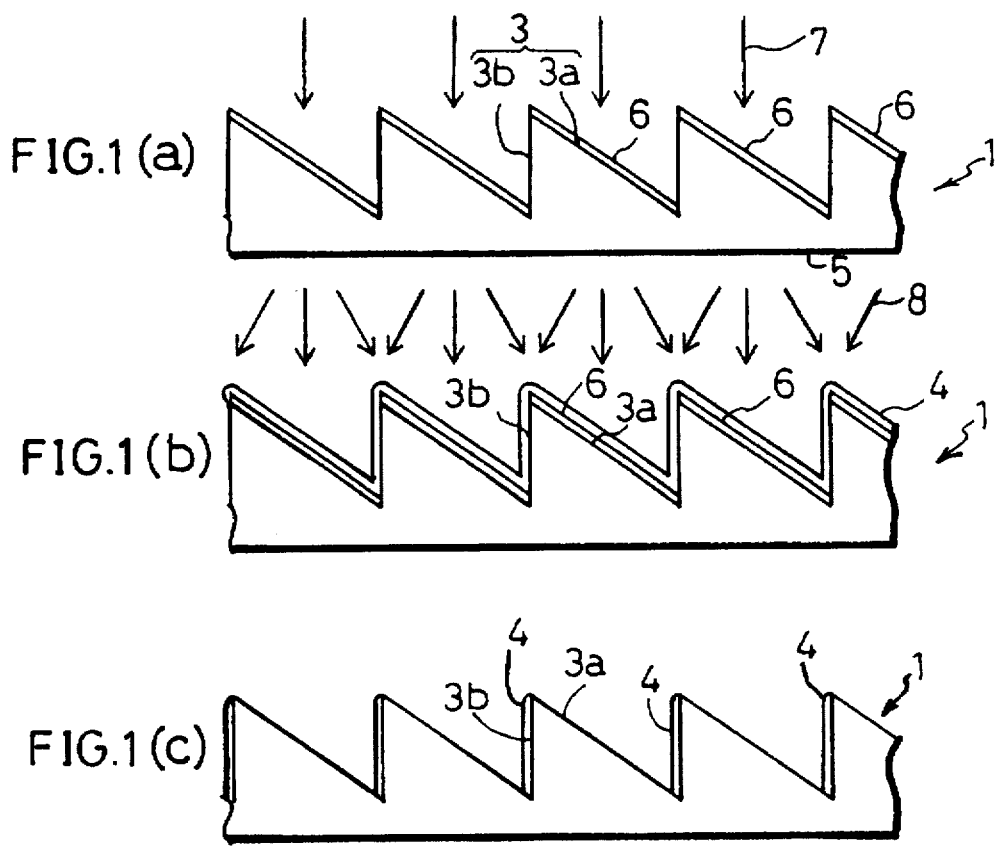
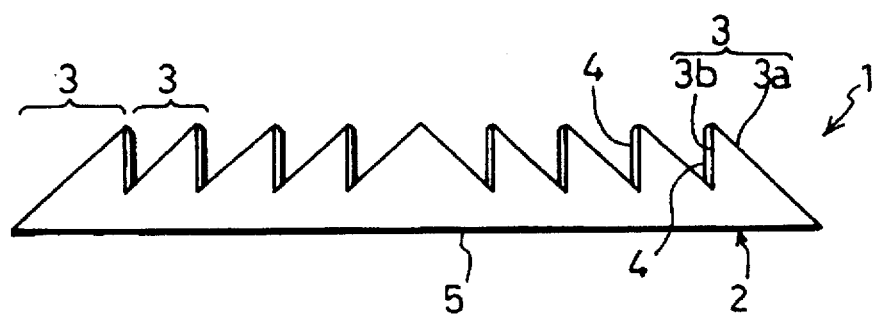

METHOD FOR FABRICATING FRESNEL LENSES BY SELECTIVE APPLICATION AND REMOVAL OF FILMS ON LENS SURFACES

FIELD OF THE INVENTION

The present invention relates to a method for fabricating a Fresnel lens capable of preventing a problem caused by the generation of "flaring light" in forming an image, and also relates to a projection-type image display device using the Fresnel lens as a field lens.

BACKGROUND OF THE INVENTION

A Fresnel lens characterized as a thin, light-weight inexpensive lens is often used as a condenser lens in a converging system, but is not used much in image formation systems since it tends to cause light "cones" and "rainbows" due to "flaring light" ("invalid" light) as described later.

As illustrated in FIGS. 10(a) and 10(b), a conventional Fresnel lens is formed by minute prisms 112 aligned in concentric circles at a predetermined pitch on a flat plate or sheet 111 of a transparent resin. Each prism 112 includes a lens surface 112a serving as a lens, and a non-lens surface 112b which does not directly function as a lens.

For example, when light 113 and light 115 fall on the lens surfaces 112a, they are refracted by the prism function.

However, not all portions of light received by the prisms 112 fall on the lens surfaces 112a, i.e., some portions of the light strike on the non-lens surfaces 112b. Moreover, some portions of the light pass through the prisms 112, but some portions of the light are reflected by the prisms 112.

For example, the angle of incidence of incident light 114 on the non-lens surface 112b differs from that of incident light on the lens surface 112a. Therefore, the incident light 114 becomes flaring light, and does not reach a correct position, i.e., a position on a screen where an image is to be formed. In addition, for example, light 116 which is present in the prisms 112 and reflected by inner sides of the lens surfaces 112a, is repeatedly reflected within the prisms 112 and becomes flaring light. Therefore, all light emerging from the prism 112 does not form an image in the correct position.

In this specification, light that does not reach the correct position for some reason and does not contribute to the formation of an image on the screen, for example, flaring light, is referred to as "invalid" light.

As described above, if the image is not formed in the correct position, a "cone" and a "rainbow" (i.e., irregular colors like a rainbow) are observed on the screen where the image is formed, lowering the quality of the projected image. The "cone" is a fan-shaped bright portion recognizable on a location of the screen above the center of a Fresnel lens whenever the Fresnel lens is used as a projection lens and the observer sees the screen from a position higher than the projection lens. When the observer sees the screen from a position lower than the projection lens, the cone is observed on a location of the screen lower than the center of the Fresnel lens.

In order to solve the above problem, Japanese Publication for Unexamined Patent Application No. 36250/1978 (Tokukaisho 53-36250) discloses a Fresnel lens having an "invalid" light absorbing film on a non-lens surface. The "invalid" light absorbing film absorbs "invalid" light which does not form an image. According to this document, coating the non-lens surface with the "invalid" light absolving film is effective means for preventing flaring light from being produced by incident light from the front and back surfaces of the lens.

Japanese Publication for Unexamined Patent Application No. 250003/1994 (Tokukaihei 6-250003) discloses three methods for coating the non-lens surface. In the first method, a photoresist is applied to the entire surface of the Fresnel lens, and light is irradiated only on the lens surface or the non-lens surface so that the photoresist remains only on the non-lens surface. The remaining photoresist is directly used as an "nvalid" light absorbing film. In the second method, after causing the photoresist to remain only on the lens surface through the above-mentioned process, a black coating resin is applied to the entire surface of the Fresnel lens, and then the photoresist is removed so that the black coating resin remains only on the non-lens surface. In the third method, the black coating resin and the photoresist are applied in this order onto the entire surface of the Fresnel lens. After causing the photoresist to remain only on the non-lens surface, the black coating resin is etched so that the black coating resin remains only on the non-lens surface.

As to a method for forming films only on the non-lens surface of the Fresnel lens, there is a method using a difference in the thickness of films. More specifically, the films are simultaneously formed on the non-lens surface and the lens surface. At this time, only the thickness of the film on the non-lens surface is made thicker using the shape of a prism section. Thereafter, using the difference in the film thickness between the lens surface and the non-lens surface, only the film on the lens surface is removed by adjusting the etching time.

Japanese Publication for Unexamined Patent Application No. 156528/1992 (Tokukaihei 4-156528) discloses a method for applying an antireflection coating onto the entire back surface opposite to the surface of the Fresnel lens on which the lenses are formed in order to prevent flaring light. In this method, by decreasing the intensity of light which becomes flaring light when reflected by the back surface of the lens, flaring light which has been repeatedly reflected inside the prisms of the Fresnel lens is prevented from coming out of the lens. The application of the antireflection coating onto the entire back surface of the Fresnel lens is relatively easy, and is advantageous in terms of the cost. Here, the antireflection coating is not applied to the non-lens surface.

Japanese Publication for Unexamined Patent Application No. 123801/1994 (Tokukaihei 6-123801) discloses a Fresnel lens having a prism section on each of the front and back surfaces thereof. Similarly to Unexamined Patent Application No. 36250/1978 mentioned above, an "invalid" light absorbing film is formed on the non-lens surface so as to prevent flaring light.

In order to prevent flaring light in a Fresnel lens which has a prism section only on one of the surfaces thereof, the above-mentioned publication, No. 123801/1994, also discloses a flat plate which is disposed on a side opposite to the prism section of the Fresnel lens and has a predetermined pattern thereon so as to prevent light from falling on the non-lens surface. Namely, by forming the pattern as a mask for preventing transmission of light on the flat plate which is provided separately from the Fresnel lens, it is possible to prevent the incident light on the non-lens surface.

Japanese Publication for Unexamined Utility Model Application No. 36485/1992 (Jitsukaihei 4-36485) discloses a method for roughening a non-lens surface so as to cause scattering reflection. Japanese Publication for Unexamined Patent Application No. 248501/1992 (Tokukaihei 4-248501) discloses an example of restraining flaring light by tilting the non-lens surface at a predetermined angle while adjusting an angle of the non-lens surface with respect to a direction perpendicular to the surface of the flat plate of the Fresnel lens. For example, a cutting method may be used for the above-mentioned processes. This is a method of cutting the lens surface and non-lens surface of the Fresnel lens with the biting teeth. The prism sections of the Fresnel lens are in the form of concentric circles, and the concentric circles are cut off one by one.

As described above, when roughening the non-lens surface so as to cause scattering reflection, a tool with rough teeth is sued for cutting the non-lens surface. In addition, as mentioned above, in order to arrange the angle of the non-lens surface with respect to the direction perpendicular to the opposite surface to be a predetermined angle, the concentric circles are cut off one by one with a tool which is set at a predetermined angle with respect to the flat base while rotating the Fresnel lens set on the flat base.

Alternatively, a stamping method may be employed. With this method, a die corresponding to a desired Fresnel lens is produced in advance, and a Fresnel lens of a desired shape is formed using the die.

However, since Fresnel lenses are usually minute and aligned in concentric circles, it is difficult to selectively coat only the non-lens surfaces with "invalid" light absorbing films for Fresnel lenses by the methods disclosed in Unexamined Patent Application No. 36250/1978 and No. 123801/1994 above.

With respect to conventional methods for selectively coating only the non-lens surfaces of Fresnel lenses with an "invalid" light absorbing film, Japanese Publication for Unexamined Patent Application No. 250003/1994 provides one example. In this example, the method of forming an "invalid" light absorbing film on a non-lens surface relies on the photosensitive properties or photosensitivity of a photoresist coating. However, this method suffers from the following two problems.

The first problem is that it is extremely difficult to apply a photoresist evenly on a Fresnel lens, or apply the photoresist so as to enable a selective exposure. For example, if a Fresnel lens has a prism pitch for 5 prisms/mm, the gap between the top and valley portions of the prism is about between 13 and 35 µm. However, the film thickness of a commercially available photoresist applied is usually between 0.5 and 5 µm. Moreover, since the non-lens surface of the Fresnel lens is substantially perpendicular to the back surface, the thickness of the photoresist is thicker in the valley portion of the Fresnel lens, while it is thinner in the top portion than in the valley portion. It is thus difficult to achieve even exposure and development, and to selectively leave the photoresist only on the non-lens surfaces.

The second problems is that it is necessary to consider the material used in forming the Fresnel lens main body. In order to fabricate the main body with a reduced cost, a method of forming the Fresnel lens main body by stamping a resin is often used. Acrylic which is inexpensive and has good light transmissivity is often used as a material for the main body. In this case, the Fresnel lens may be corroded by a solvent used for removing the applied photoresist. On the other hand, heat between 100° amd 140° C. is applied to the Fresnel lens in the process using the photoresist. It is therefore necessary to select a material which is durable under such temperatures. This may cause an increase in the cost of the material of the Fresnel lens.

On the other hand, with the method using a difference in the thickness between films, since adjusting the etching time is difficult, it is difficult to selectively cause a desired film to remain. Thus, the fabrication of the Fresnel lens cannot be easily performed.

In the Fresnel lens disclosed by Unexamined Patent Application No 156528/1992 above, an antireflection coating is applied only to the entire back surface. Thus, the non-lens surface is not coated. As a result, the optical path of light passing through the lens surface differs from the optical path of light passing through the non-lens surface. This causes interference of light, and lowers the quality of a projected image.

Unexamined Patent Application No. 123801/1994 above discloses a method of forming the pattern as the mask for preventing the transmission of light on a position of a flat base of the Fresnel lens opposite the non-lens surface onto which the non-lens surface is projected. In this method, the incident angle for restraining the transmission of light is spontaneously limited. In order to effectively restrain the transmission of light by increasing the incident angle, it is necessary to increase the width of the pattern. However, this causes a reduction in the amount of light passing through the lens. As a result, sufficient brightness is not ensured on the screen, and the quality of the projected image is lowered. Moreover, the cost is increased due to the formation of the pattern.

As to the fabrication of the Fresnel lens using a cutting tool, since the prism pitch of the Fresnel lens is very small, it usually takes a long time to cut the circles of prisms one by one. For example, if the prism pitch is three prisms per mm, even when the overall size of the Fresnel lens is several square centimeters, the number of prisms (i.e., the number of concentric circles) becomes extremely large.

In the method for roughening the non-lens surface to produce scattering reflection, disclosed by Utility Model Application No. 36485/1992 above, if a method using a cutting tool is adopted, it is necessary to suitably adjust the roughness of the teeth for the non-lens surface and the lens surface respectively, requiring an extremely long time. In addition, adjusting the cutting tool to have a suitable teeth roughness increases the cost.

When a stamping method is used with the technique disclosed by Utility Model Application No. 36485/1992 above, it is necessary to roughen the surface of a portion of a die corresponding to the lens surface in advance, resulting in an increase in the cost.

In the method for restraining flaring light by adjusting the angle of the non-lens surface with respect to the direction perpendicular to the opposite surface as disclosed in Unexamined Patent Application No. 248501/1992 above, when fabricating the Fresnel lens by the method using a cutting tool, since the prisms of the Fresnel lens are minute, it is necessary to perform more precise processing than a conventional case so as to obtain correct angles of the lens surface and the non-lens surface. As a result, an extremely long time is required, and the cost is increased.

In the technique disclosed by Unexamined Patent Application No. 245801/1992 above, if a stamping method is used, since the prisms of the Fresnel lens are minute like the above, it is necessary to perform more precise processing than the conventional case in order to obtain correct angles of the lens surface and the non-lens surface. Therefore, a higher cost is required.

In the Fresnel lens of Unexamined Patent Application No. 123801/1994, a prism section is formed on each of the front and back surfaces due to the reasons mentioned above, and therefore the cost is further increased.

SUMMARY OF THE INVENTION

It is an object of the present invention to provide a method for fabricating a Fresnel lens capable of producing a high-quality projected image by reducing the generation of cone and rainbow effects and ensuring sufficient brightness on the screen, in a simplified and easy manner requiring less time with reduced cost.

It is another object of the present invention to provide a projection-type image display device using the Fresnel lens as a field lens.

In order to achieve the above object, a first method for fabricating a Fresnel lens according to the present invention includes the steps of:

preparing a Fresnel lens main body, including a plurality of prisms having lens surfaces and non-lens surfaces that face a direction different from the direction toward which the lens surfaces face, the Fresnel lens main body converging light which has passed through the lens surfaces;

forming a primary film coating on each lens surface by depositing primary film material on only the lens surfaces;

forming a secondary "invalid" light (i.e., flaring light) absorbing film for reducing transmission of light on both the coated lens surfaces an on the non-lens surfaces; and removing both the primary film and the flaring light ("invalid" light) absorbing film from only the lens surfaces.

With this structure, since the material of the primary film is deposited toward the lens surface, the primary film can be easily formed on the lens surface. In this case, since the non-lens surface faces a direction different from a direction toward which the lens surface faces, the material of the primary film does not reach the non-lens surface and the primary film is not formed thereon. Therefore, the primary film is formed only on the lens surface.

The "invalid" light absorbing film is formed on both the coated lens surfaces and on the non-lens surfaces. The "invalid" light absorbing film is formed directly on the non-lens surface. It is also formed on the lens surface over the primary film.

Subsequently, the primary film and the "invalid" light absorbing film are simultaneously removed, leaving only the "invalid" light absorbing film on the non-lens surface.

The above-mentioned process enables the formation of "invalid" light absorbing films only on the non-lens surfaces. As a result, light wave interference is not produced by a difference in the optical path between light passing through the lens surfaces and light passing through the non-lens surfaces, and, thus, flaring light effects are not generated.

Therefore, if the Fresnel lens is used, for example, as the field lens of a projection-type image display device, the generation of cone and rainbow effects is reduced, thereby producing a high-quality projected image.

In addition, the amount of light passing through the Fresnel lens is not reduced. Consequently, when the Fresnel lens is used as a field lens of a projection-type image display device as mentioned above, it is possible to produce a high-quality projected image because sufficient brightness is ensured on the screen.

With this method, since photoresist is not used, the thickness of the photoresist in the valley portion of the Fresnel lens does not become greater, and the thickness of the photoresist in the top portion thereof does not become thinner. Thus, as distinguished from prior art photoresist methods, this method does not entail the difficulties in obtaining an even exposure and even development.

Moreover, since the materials of the primary film and the "invalid" light absorbing film are suitable for depositing over a wide range of temperatures, it is possible to perform the deposition at low temperature.

Unlike the above-mentioned method of forming films using a difference in the thickness between the films, there is no need to adjust the difference in the thickness between the films with the etching time.

It is also not necessary to form a pattern as a mask which does not transmit light on a position of a flat back surface of a Fresnel lens onto which position the non-lens surface is projected, thereby reducing the cost of fabricating the Fresnel lens.

Furthermore, it is not necessary to roughen the non-lens surfaces so as to cause scattering reflection and restrain emergence of flaring light by adjusting the angle of the non-lens surface with respect to a direction perpendicular to the opposite surface. It is therefore not necessary to adjust the roughness of the teeth of a cutting tool and roughen the surface of a die. Namely, it is not necessary to fabricate the prisms and die as precisely as in a conventional manner. Consequently, it is possible to fabricate the Fresnel lens with a shorter time and a reduced cost.

Additionally, it is not necessary to selectively form the "invalid" light absorbing film only on the non-lens surface. The above-mentioned process of forming the "invalid" light absorbing film is easily carried out by an established technique, such as sputtering and p-CVD (plasma chemical vapor deposition). The removal of the primary film is also easily performed using an established technique, for example, etching. It is thus possible to easily fabricate the Fresnel lens.

A second method for fabricating a Fresnel lens according to the present invention is based on the first method, and characterized by that the material of the primary film is selected from the group consisting of metal and oxide, the material of the "invalid" light absorbing film is selected from the group consisting of metal, oxide, carbon, sublimation pigment, and sublimation dye, and the material of the primary film and the material of the "invalid" light absorbing film have different types of solvents from each other or the same type of solvents with different concentrations.

With this structure, since the primary film is metal or oxide, it is possible to select an inorganic solvent such as acid and alkali rather than an organic solvent which directly damages the Fresnel lens when removing the primary film. It is therefore possible to prevent the Fresnel lens from being eroded in the fabrication process.

In addition, since the material of the "invalid" light absorbing film is selected from the group consisting of oxide, carbon, sublimation pigment, and sublimation dye which has a different type of solvent from that of the material of the primary film or a solvent which is of the same time but has a different concentration, it is possible to selectively leave the "invalid" light absorbing film only on the non-lens surface without damaging the "invalid" light absorbing film when removing the primary film. Consequently, the "invalid" light absorbing film can be easily formed on the non-lens surface.

A third method for fabricating a Fresnel lens according to the present invention is based on the first method, and is characterized by constructing the Fresnel lens so that the plurality of prisms are aligned in concentric circles on a flat base and that the non-lens surface tilts at a predetermined angle with respect to a direction perpendicular to the flat base, and wherein the step of forming the primary film includes:

using a mask having a fan-shaped or angular opening section, whose center angle is not larger than 90 degrees, on the side of the Fresnel lens on which the primary film is to be deposited;

tilting a depositing direction of the material of the primary film at an angle not larger than 10 degrees from a first direction toward a second direction, wherein the first direction is perpendicular to the flat base and the second direction is perpendicular to the lens surfaces of the prisms located in the opening section; and depositing the material of the primary film while rotating the Fresnel lens.

In other words, the angle of the depositing direction is not greater than 10 degrees as measured from a perpendicular to the flat base of the Fresnel lens toward the outer perimeter of the Fresnel lens.

Using this method, the material of the primary film is first deposited. The mask having the angular or fan-shaped opening section is used on the side where the primary film is to be deposited. Next, the material of the primary film is deposited while rotating the Fresnel lens. By using a mask having an angular opening of 90 degrees or less, the material of the primary lens can be prevented from being deposited onto the non-lens surfaces of the prisms whose non-lens surfaces face the depositing direction. Thus, the primary film is formed only on the lens surfaces of the prisms located in the opening section by preventing the deposition of the primary film on the non-lens surfaces of the prisms that face the depositing direction by the blocking action of the mask. Consequently, it is possible to easily fabricate a Fresnel lens having a flaring-light ("invalid" light) absorbing film on the non-lens surface of its main body, which tilts at a predetermined angle with respect to the perpendicular direction to the flat base.

Moreover, since the center angle of the mask opening is set not larger than 90 degrees, the material of the primary film can be prevented from penetrating into a gap between a periphery section of the mask and the Fresnel lens main body. Therefore, the primary film can be prevented from being formed on the non-lens surface of the Fresnel lens. As a result, the primary film is effectively formed only on the lens surface of the Fresnel lens. It is thus possible to more easily fabricate the Fresnel lens.

Moreover, since the direction from which the material of the primary film is deposited originates from a direction toward which the lens surfaces of the prisms located within the mask opening section face, the material of the primary film is not deposited on non-lens surfaces of the prisms whenever the non-lens surfaces are tilted at a predetermined angle with respect to a direction perpendicular to the flat base of the lens and the lens surfaces face the depositing direction. Therefore, even with the particular method of Fresnel lens main body construction mentioned above, fabrication of the lens with an "invalid" light absorbing film formed over all the non-lens surfaces is made possible and easy.

Additionally, since the angle of the depositing direction is not greater than 10 degrees as measured from a perpendicular to the flat base of the Fresnel lens toward the outer perimeter of the Fresnel lens, the material of the primary film can reach the target lens surfaces without being blocked by the lens surface of an adjacent prism. As a result, the material of the primary film can satisfactorily reach substantially the entire area of any target lens surface. Accordingly, using the same arrangement, since the primary film can be formed over substantially the entire area of the lens surface, it is likewise possible to remove the "invalid" light absorbing film from the entire surface of the lens surface. From these things, the Fresnel lens is able to be fabricated.

A first projection-type image display device of the present invention is characterized by using a Fresnel lens, fabricated by the above-mentioned first, second or third method, as a field lens.

In these fabrication methods mentioned above, since the Fresnel lens formed by the first, second or third method is used as a field lens, the interference of light can never be caused by the difference in optical path between light passing through the lens surface and light passing through the non-lens surface, and, thus, the generation of flaring light can be prevented. In addition, the amount of light passing through the Fresnel lens can never be reduced.

As a result, the generation of a cone and a rainbow is restrained, and sufficient brightness is ensured on the screen. Therefore, a high-quality projected image can be realized.

For a fuller understanding of the nature and advantages of the invention, reference should be made to the ensuing detailed description taken in conjunction with the accompanying drawings.

BRIEF DESCRIPTION OF THE DRAWINGS

FIGS. 1(a) 1(b) and 1(c) are explanatory views schematically illustrating processes in a method for fabricating a Fresnel lens according to one embodiment of the present invention.

FIG. 2 is a plan view schematically illustrating an overall structure of the Fresnel lens shown in FIGS. 1(a) to 1(c).

DETAILED DESCRIPTION OF THE PREFERRED EMBODIMENTS

Figure 3:
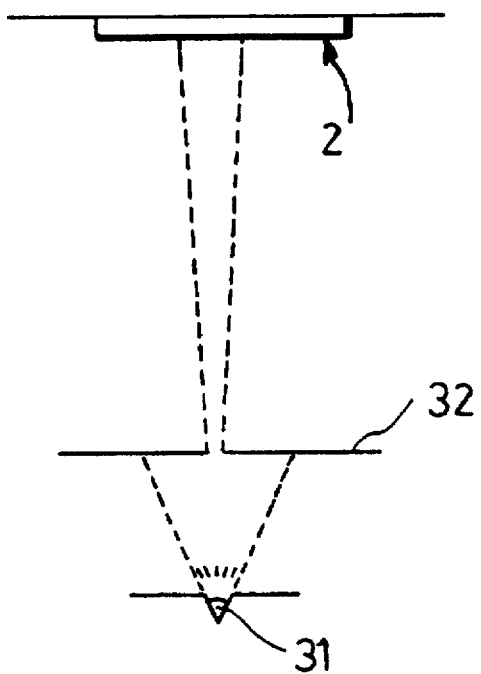
FIG. 3 is an explanatory view illustrating the process of fabricating the Fresnel lens shown in FIGS. 1(a) to 1(c) by resistive heating evaporation.

The following description discusses a first embodiment of the present invention.

As illustrated in FIG. 2, a Fresnel lens 1 fabricated by a fabrication method of this embodiment includes a Fresnel lens main body 2 in which a plurality of prisms 3 having lens surfaces 3a and non-lens surfaces 3b are aligned into concentric circles on a flat base 5 of a transparent resin. When parallel light falls on each lens surface 3a, it passes through the lens surface 3a and is then converged. An "invalid" light absorbing film 4 for restraining the transmission of light is formed on the non-lens surface 3b of each prism 3.

Here, light that does not reach the correct position for some reason and does not contribute to the formation of an image on a screen, for example, flaring light, is referred to as "invalid" light.

The non-lens surfaces 3b are perpendicular to the flat base 5.

Referring now to FIG. 1(a) to FIG. 1(c), the following description explains the process of forming the "invalid" light absorbing films 4 on the non-lens surfaces 3b.

This embodiment uses a lift-off method as a kind of thin-film deposition technique.

First, as illustrated in FIG. 1(a), deposition particles 7 as a material (lift-off material) of primary films 6 are evaporated from a direction to which the lens surfaces 3a face toward the lens surfaces 3a.

By this, it is possible to easily deposit the deposition particles 7 all over the lens surfaces 3a so as to form the primary films 6.

At this time, since the non-lens surfaces 3b face a different direction from the lens surfaces 3a, the deposition particles 7 can hardly be deposited on the non-lens surfaces 3b during evaporation. Consequently, the deposition particles 7 are not deposited, and the primary films 6 are not formed on the non-lens surface, and thus the primary films 6 are formed substantially only on the lens surfaces 3a.

With respect to the material of the deposition particles 7, it is desirable to use a material which permits easy etching and selective etching between the primary films 6 and the "invalid" light absorbing films 4 formed thereafter. In this embodiment, Al (aluminum) which can be etched by either acid or alkali is used.

As to the method for forming the primary films 6, evaporation is preferable because the lift-off material does not much reach the non-lens surfaces 3b and the film forming speed (deposition speed) is easily adjustable. For example, resistive heating evaporation and EB (electron beam) evaporation are preferable. In this embodiment, resistive heating evaporation is used.

As illustrated in FIG. 3, in order to restrain the deposition of the deposition particles 7 on the non-lens surfaces 3b, when the deposition particles 7 are deposited from a source material 31 onto the Fresnel lens main body 2, an aperture 32 may be arranged through an element in the vicinity of the source material 31. With this arrangement, since the spread of the deposition particles 7 is cut down, it is possible to precisely determine the area of the deposition particles 7.

The film thickness of the primary films 6, which is not serious in this case, is around 500 to 1000 angstroms.

As illustrated in FIG. 1(b), the "invalid" light absorbing films 4 are formed by sputtering, on both the lens surfaces 3a on which the primary films 6 are formed and the non-lens surfaces 3b on which the primary films 6 are not formed. Specifically, the "invalid" light absorbing films 4 are formed by depositing a material, i.e., sputtering particles 8. As a result, the "invalid" light absorbing films 4 are directly formed on the non-lens surfaces 3b, while the "invalid" light absorbing films 4 are formed on the lens surfaces 3a through the primary films 6.

A black material with a low visible light transmissivity is used for the sputtering particles 8 as a material of the "invalid" light absorbing films 4. In this embodiment, $MnFe_2O_4$ is used as an Fe-Mn series compound. This material was developed as a light blocking film for a TFT (thin film transistor) liquid crystal, and is disclosed in Japanese Publication for Unexamined Patent Application No. 72523/1993.

When this material is formed into a film with a thickness of 500 angstroms, the visible light transmissivity is not higher than 1%. Since a visible light transmissivity of around 10% is even sufficient for achieving the object of the present invention, it is possible to further decrease the film thickness. In this embodiment, the "invalid" light absorbing films 4 are arranged to have a film thickness between 2000 and 5000 angstroms.

As to the method for forming the "invalid" light absorbing films, differently from the lift-off material, it is necessary to use a method which has a large acceptance angle in order to reach both the lens surfaces 3a and the non-lens surfaces 3b. For example, sputtering and p-CVD (plasma chemical vapor deposition) are preferably used. In this embodiment, sputtering is employed.

Figure 4:
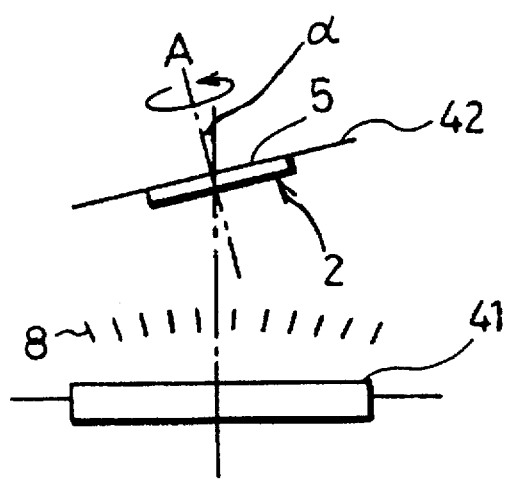
FIG. 4 is an explanatory view illustrating the process of fabricating the Fresnel lens shown in FIGS. 1(a) to 1(c) by sputtering.

However, since both the surfaces tilt at quite large angles from the flat base 5, when the "invalid" light absorbing films 4 are formed all over the lens surfaces 3a, it is more preferable to perform sputtering as follows. Specifically, as illustrated in FIG. 4, a mounting surface 42 on which the Fresnel lens main body 2 is placed is arranged to tilt at an angle of α with respect to a direction in which the sputtering particles 8 come from a target 41. In other words, the depositing direction of the sputtering particles 8 is arranged to tilt at an angle of α with respect to a line A perpendicular to the flat base 5. Then, the "invalid" light absorbing films 4 are formed while rotating the Fresnel lens main body 2 on its own axis corresponding to the perpendicular line A.

Alternatively, evaporation may be used as the method for forming the "invalid" light absorbing films 4. However, unlike the sputtering method, the material ratio may be varied during evaporation. In this case, it is necessary to form the "invalid" light absorbing films 4 all over the surfaces of the prisms 3 (the lens surfaces 3a and the non-lens surfaces 3b) by making some adjustments, for example, tilting the Fresnel lens main body 2 in various directions.

Finally, as illustrated in FIG. 1(c), the primary films 6 are removed from the lens surfaces 3a. In this embodiment, since $MnFe_2O_4$ as the material of the "invalid" light absorbing films 4 does not dissolve in alkali, the Fresnel lens main body 2 having the primary films 6 formed thereon is soaked in the alkali solution. It is preferable to use a suitably dilute solution of, for example, NaOH, KOH or organic alkali. As mentioned above, since Al can be etched by alkali, the primary films 6 of Al are etched while leaving the "invalid" light absorbing films 4 only on the non-lens surfaces 3b.

At this time, not only the primary films 6 are removed from the lens surfaces 3a, but also the "invalid" light absorbing films 4 thereon are removed. Thus, the "invalid" light absorbing films 4 remain only on the non-lens surfaces 3b.

With the above-mentioned processes, it is possible to from the "invalid" light absorbing films 4 only on the non-lens surfaces 3b. As a result, the light interference due to a difference in the optical path between light passing through the lens surfaces 3a and light passing through the non-lens surfaces 3b does not occur, preventing the generation of flaring light. Therefore, when the Fresnel lens 1 is used as a field lens of a projection-type image display device, since the generation of a cone and a rainbow is restrained, it is possible to obtain a high-quality projected image.

Moreover, the amount of light passing through the Fresnel lens 1 is not reduced. Thus, when the Fresnel lens 1 is used as a field lens of the projection-type image display device, since sufficient brightness of the screen is ensured, it is possible to obtain a high-quality projected image.

Additionally, with this method, since a photoresist is not used, it is possible to prevent such a problem that the thickness of photoresist becomes thicker in valley sections of the Fresnel lens 1 and thinner in top sections thereof. It is therefore not difficult to achieve even exposure and development.

Furthermore, when depositing the primary films 6 and the "invalid" light absorbing films 4, since the deposition temperature is suitably adjustable, it is possible to perform deposition at low temperatures.

Unlike the conventional film forming technique using a difference in the thickness between films, it is not necessary to adjust the difference in the thickness between the films by adjusting the etching time. It is thus possible to easily fabricate the Fresnel lens 1.

In addition, there is no need to form a pattern as a mask for preventing the transmission of light to positions on the flat base 5 where the non-lens surfaces 3b are projected. It is therefore possible to produce the Fresnel lens 1 with a reduced cost.

It is also not necessary to roughen the non-lens surfaces 3b so as to cause scattering reflection and adjust the angle between the non-lens surface 3b and the flat base 5 so as to restrain the emergence of flaring light. Thus, the necessity of adjusting the roughness of the teeth of a cutting tool and of roughening the surface of a die is eliminated. Consequently, less precision is required in processing the prisms and the die compared to a conventional case. From these points, fabricating the Fresnel lens 1 with a shorter time and a reduced cost is possible.

It is also not necessary to selectively and directively deposit the "invalid" light absorbing films 4 only on the non-lens surfaces 3b. As a result, the "invalid" light absorbing films 4 are easily formed by an established technique, such as sputtering and p-CVD. The process of removing the primary films 6 is also easily carried out by an established technique, for example, etching. It is thus possible to easily fabricate the Fresnel lens 1.

In this embodiment, Al is used for the deposition particles 7 of the primary films 6, and $MnFe_2O_4$ is used for the sputtering particles 8 of the "invalid" light absorbing films 4. However, it is also possible to use other materials, for example, the materials listed in Table 1.

TABLE 1

| Group | Materials of "invalid" light absorbing films | Materials of primary films |
|---|---|---|
| 1 | Fe—Mn series oxides ($MnFe_2O_4$, etc.) Carbon | Al, Al—Cu |
| 2 | Mn—O series ($MnO_2$, MnO) | Al, Al—Cu |
| 3 | Ta—$SiO_2$ V—O series (VO, $V_2O_3$, etc.) | Al, Al—Cu, FeO series Si, Ti |
|  | $Ta_2N$ | Al, Al—Cu |

Namely, the material of the primary films 6 is preferably metal or an oxide material, and the material of the "invalid" light absorbing films 4 is preferably metal, oxide, or carbon. Group 1 is more preferable than group 2, and group 2 is more preferable than group 3. The materials in a group of a higher preferential order are easier to handle and form into a film. In addition, since the etching selective ratio is high, it is possible to easily prevent an imperfect removal of the primary films 6 and damage to the "invalid" light (flaring light) absorbing films 4 on the non-lens surfaces 3b. Moreover, the damage to the Fresnel lens surface is reduced.

When the materials of the primary films 6 in group 3 are the FeO series, Si and Ti, it is possible to perform etching with acid, and a selectivity is given by suitably adjusting the concentration.

Some other examples of the material of the "invalid" light absorbing film are a naphthalene diamine compound, a dioxozin compound, sublimation pigment such as ethylene series low-boiling point crystalline material. In this case, the material of the primary films 6 is Al and Al-Cu.

It is also possible to use sublimation dye, for example, leuco dye as the material of the "invalid" light absorbing films 4, and use Al and Al-Cu as the material of the primary films 6.

Since the primary films 6 are metal or oxide series, a solvent to be used for removing the primary films 6 is selected from inorganic series solvents such as acid rather than organic series solvents which directly damage the Fresnel lens 1. It is thus possible to prevent the Fresnel lens 1 from deteriorating in the fabrication process of the Fresnel lens 1.

As to the materials for the "invalid" light absorbing films 4, it is possible to use any material selected from the group consisting of metal, oxide, carbon, sublimation pigment and sublimation dye which has a solvent different from a solvent of the material of the primary films 6, i.e., a solvent which dissolves the material of the primary films 6 but does not dissolve the material of the "invalid" light absorbing films 4. It is therefore possible to selectively leave the "invalid" light absorbing films 4 only on the non-lens surfaces 3b without damaging the "invalid" light absorbing films 4 when removing the primary films 6. Consequently, the "invalid" light absorbing films 4 are easily formed on the non-lens surfaces 3b.

Figure 5:
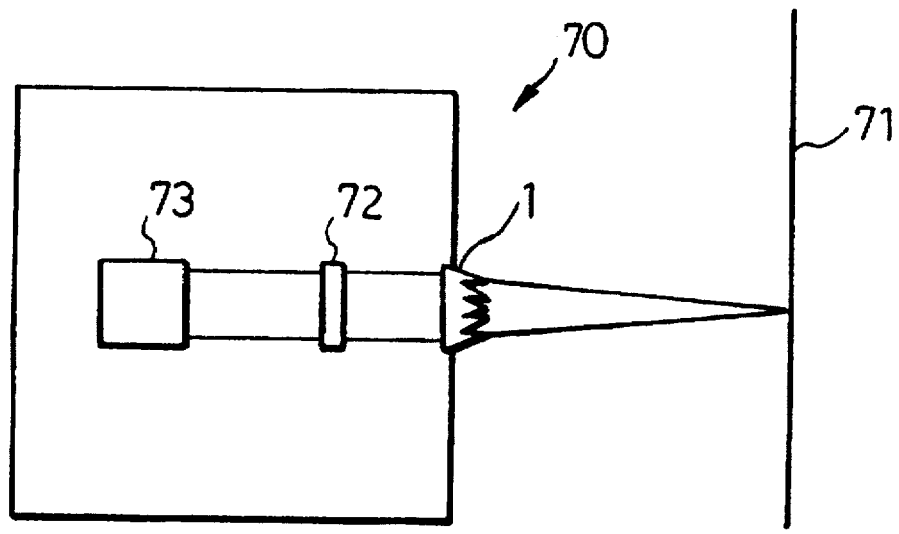
FIG. 5 is an explanatory view illustrating the schematic structure of a projection-type image display device using the Fresnel lens shown in FIGS. 1(a) to 1(c).

Referring now to FIG. 5, the following description discusses the use of the Fresnel lens 1 fabricated by the above-mentioned method as a field lens of a projection-type image display device.

A projection-type image display device 70 includes a light source 73 and the Fresnel lens 1. The light source 73 irradiates light on an original image 72 to be projected. The Fresnel lens 1 forms an image on a screen 71 by converging a light image which has passed through the original image 72.

In the projection-type image display device 70, among light from the light source 73 which has passed through the original image 72 and fallen on the Fresnel lens 1, incident light on the non-lens surfaces 3b and flaring light are blocked by the "invalid" light absorbing films 4. Consequently, this device 70 does not generate the interference light due to a difference in the optical path between the light passing through the lens surfaces 3a and the light passing through the non-lens surfaces 3b, thereby preventing generation of flaring light. In addition, the amount of light passing through the Fresnel lens 1 is not reduced.

As a result, a cone and rainbow are restrained, and sufficient brightness is ensured on the screen 71, thereby producing a high-quality projected image.

The following description discusses a second embodiment of the present invention with reference to FIGS. 6 to 9. For the sake of explanation, the members having the same function as in the above-mentioned embodiment will be designated by the same code and their description will be omitted.

Figure 6:
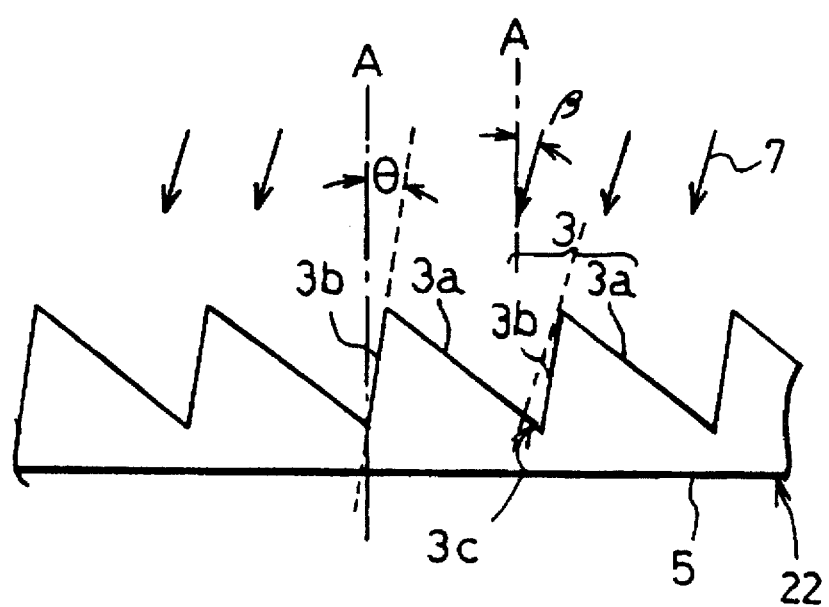
FIG. 6 is a plan view illustrating the schematic structure of essential sections of a Fresnel lens according to another embodiment of the present invention.
Figure 7:
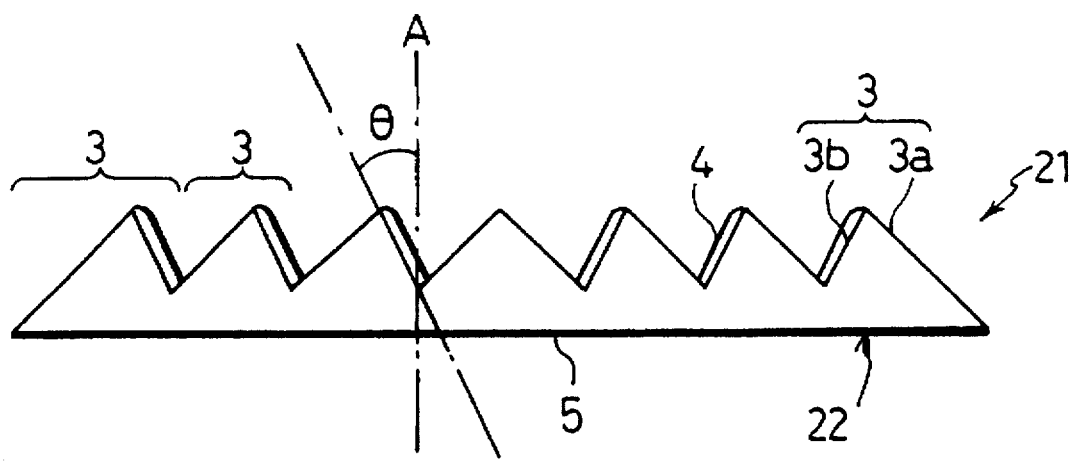
FIG. 7 is a plan view schematically illustrating an overall structure of the Fresnel lens shown in FIG. 6.

As illustrated in FIGS. 6 and 7, in a Fresnel lens fabricated by a fabrication method of this embodiment, the non-lens surfaces 3b of the prisms 3 on a Fresnel lens main body 22 are not perpendicular to the flat base 5 and tilt at a predetermined angle θ toward the periphery of the concentric circle (the right in FIG. 6). θ is substantially not larger than 4 degrees.

In this embodiment, if θ is not zero, when the deposition particles 7 are deposited from a direction perpendicular to the flat base 5 like Embodiment 1, a problem arises that the deposition particles 7 are also deposited on the non-lens surfaces 3b.

Then, in this embodiment, the deposition particles 7 are deposited from a direction which tilts at a predetermined angle β toward a tilting direction of θ ( the periphery of the concentric circle) from a direction A which is perpendicular to the flat base 5. In other words, the deposition particles 7 are deposited from a direction which tilts at the predetermined angle β from the direction A toward a direction perpendicular to the lens surfaces 3a of the prisms 3 in an opening section 62 of a mask 61 to be described later. Here, β is not smaller than 74 .

Thus, the Fresnel lens 21 having the "invalid" light absorbing films 4 over all the non-lens surfaces 3b of the Fresnel lens main body 22 can be fabricated. Consequently, it is possible to easily fabricate the Fresnel lens 21 having prisms whose shapes are varied as mentioned above so as to change the optical characteristic thereof, i.e., the Fresnel lens 21 in which the "invalid" light absorbing films 4 are formed on the non-lens surfaces 3b of the Fresnel lens main body 22, which tilts at a predetermined angle of θ with respect to the direction A perpendicular to the flat base 5.

It is preferable to arrange β to be not larger than 10 degrees. If the angle β is extremely large, the deposition particles 7 are blocked by the adjacent lens surface 3a and do not reach a part (shown by 3c) or all of the target lens surfaces 3a. Such a problem is eliminated by setting the angle β to be not larger than 10 degrees. Consequently, the deposition particles 7 are satisfactorily deposited substantially all over the target lens surfaces 3a. With this arrangement, since the primary films 6 are formed substantially all over the lens surfaces 3a, it is possible to remove "invalid" light absorbing films 4 from substantially all of the lens surfaces 3a. It is thus possible to easily fabricate the Fresnel lens 21.

Figure 8:
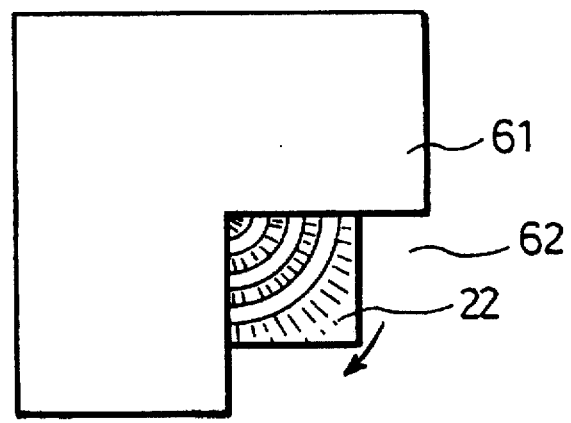
FIG. 8 is a plan view illustrating the schematic structure of the Fresnel lens shown in FIG. 7 and a mask.

Moreover, in this embodiment, as illustrated in FIG. 8, when depositing the deposition particles 7, a mask having the fan-shaped opening section 62 whose center angle is not larger than 90 degrees is formed on the surface on which the primary films 6 are to be formed, and the deposition particles 7 are deposited while rotating the Fresnel lens main body 22. The prisms of the Fresnel lens main body 22 is covered with a square surface of the mask 61. The mask 61 is formed so that the center of the fan shape equals the center of the Fresnel lens main body 22. A part (here, a quarter) of the prisms is exposed in a fan shape by the opening section 62.

Figure 9:
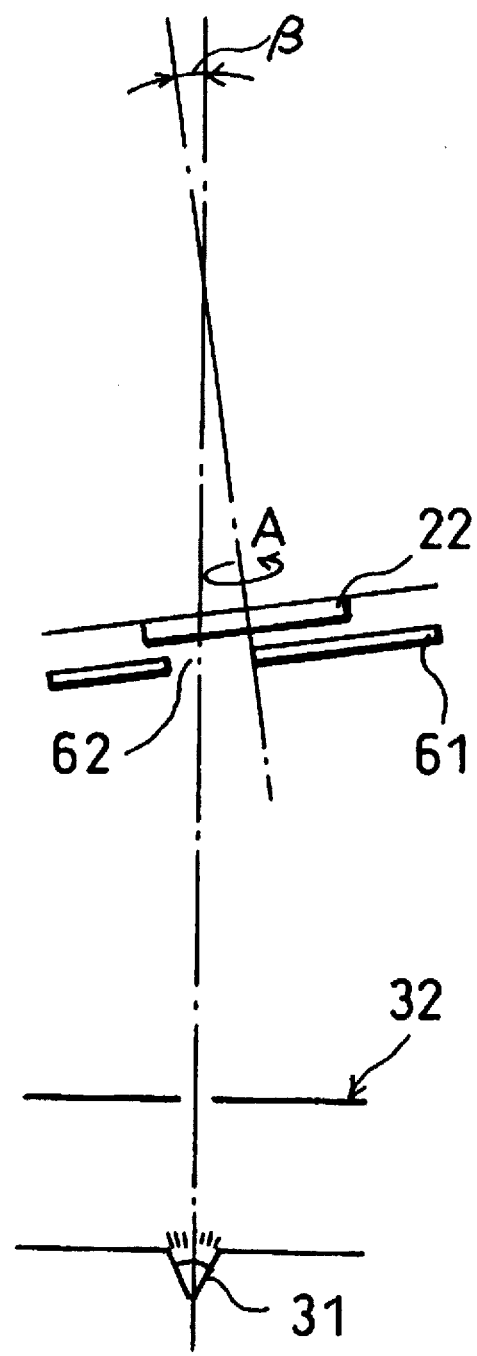
FIG. 9 is an explanatory view illustrating the process of fabricating the Fresnel lens shown in FIG. 7 by resistive heating evaporation.
Figure 10:
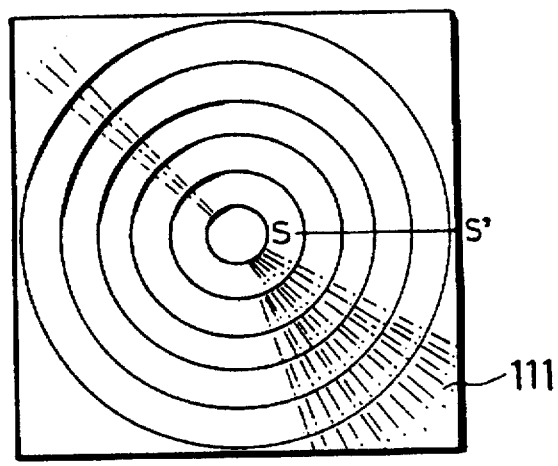
FIGS. 10(a) and 10(b) are explanatory views illustrating the schematic structure of a conventional Fresnel lens.
Figure 10:
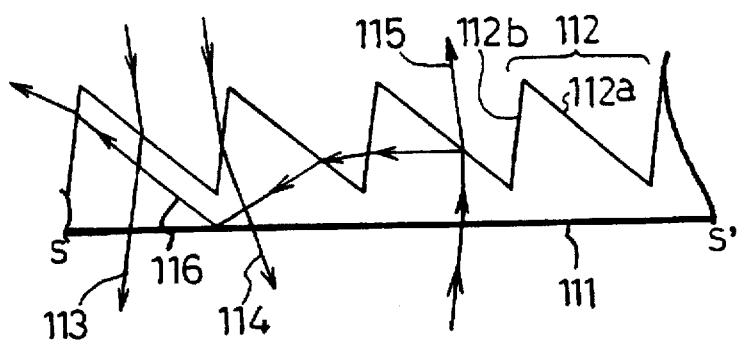

This structure is shown in FIG. 9. More specifically, the deposition particles 7 which have released from a source material 31 and passed through an aperture 32 are deposited toward the Fresnel lens main body 22. Then, the deposition particles 7 are deposited on the lens surfaces 3a of the prisms 3 in the opening section 62 of the mask 61.

As described above, since some prisms 3 are covered by the mask 61, it is possible to prevent deposition of the deposition particles 7 on the non-lens surfaces 3b of the prisms 3, which face the depositing direction. It is therefore possible to prevent the primary films 6 from being formed on the non-lens surfaces 3b of the prisms 3, which face the depositing direction of the deposition particles 7. Namely, it is possible to form the primary films 6 only on the lens surfaces 3a of the prisms 3 located in the opening section 62. Consequently, the Fresnel lens 2 is easily fabricated.

In addition, since the center angle of the opening section 62 is set to be not larger than 90 degrees, it is possible to avoid the primary films 6 from being formed on the non-lens surfaces 3b by preventing some deposition particles 7 from penetrating into a gap between the edge of the mask 61 and the Fresnel lens main body 22 and reaching the non-lens surfaces 3b. As a result, the primary films 6 can be efficiently formed only on the lens surfaces 3a. It is thus possible to easily fabricate the Fresnel lens 21.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a Fresnel lens having a lens main body for converging light passed through a lens surface comprising the steps of:

preparing the Fresnel lens main body with a plurality of prisms having lens surfaces and non-lens surfaces facing different directions from each other;

forming a primary film on each lens surface by depositing a material of said primary film only on said lens surfaces;

forming an invalid light absorbing film for restraining transmission of light on said lens surfaces and said non-lens surfaces; and removing said primary film and the invalid light absorbing film from said lens surfaces.

2. The method for fabricating a Fresnel lens according to claim 1, wherein the material of said primary film is deposited by evaporation.

3. The method for fabricating a Fresnel lens according to claim 1, wherein the step of forming said primary film on each lens surface includes positioning an element with an aperture through said element in the vicinity of a deposition source of the material of said primary film for passing the material of said primary film from said source, through said aperture and onto said lens surface.

4. The method for fabricating a Fresnel lens according to claim 1, wherein said "invalid" light absorbing film is formed by depositing a material of said "invalid" light absorbing film.

5. The method for fabricating a Fresnel lens according to claim 4, wherein the material of said "invalid" light absorbing film is deposited by sputtering.

6. The method for fabricating a Fresnel lens according to claim 4, wherein the lens has an axis and wherein the step of forming said invalid light absorbing film includes tilting a depositing direction of the material of said invalid light absorbing film at a predetermined angle relative to said axis and rotating said Fresnel lens main body on its own axis.

7. The method for fabricating a Fresnel lens according to claim 1, wherein the material of said primary film is selected from the group consisting of metal and oxide, the material of said "invalid" light absorbing film is selected from the group consisting of metal, oxide, carbon, sublimation pigment, and sublimation dye, and the material of said primary film and the material of said "invalid" light absorbing film are soluble in different types of solvents.

8. The method for fabricating a Fresnel lens according to claim 1, wherein said Fresnel lens main body is constructed so that the plurality of prisms are aligned in concentric circles on a flat base and that said non-lens surfaces tilt at a predetermined angle with respect to a first direction perpendicular to said flat base, and wherein the step of forming said primary film includes:

using a mask having a fan-shaped opening section whose center angle is not larger than 90 degrees on a side on which said primary film is to be formed;

tilting a depositing direction of the material of said primary film at an angle not larger than 10 degrees from said first direction toward a second direction, wherein said first direction is perpendicular to said flat base and the second direction is perpendicular to the lens surfaces of said prisms located within said opening section; and depositing the material of said primary film while rotating said Fresnel lens main body.

9. A method according to claim 1 wherein the step of depositing the primary film is accomplished by evaporation and the step of forming the invalid light absorbing film is accomplished by sputtering.

10. A method according to claim 9 wherein the step of evaporation includes electron beam evaporation.

11. A method according to claim 9 wherein the step of evaporation includes resistive heating evaporation.

12. A method according to claim 1 wherein the step of depositing the primary film is accomplished by evaporation and the step of forming the invalid light absorbing film is accomplished by plasma chemical vapor deposition.

13. A method according to claim 12 wherein the step of evaporation includes electron beam evaporation.

14. A method according to claim 12 wherein the step of evaporation includes resistive heating evaporation.

15. A method for fabricating a Fresnel lens having a lens main body for converging light passed through a lens surface comprising the steps of:

preparing the Fresnel lens main body with a plurality of prisms having lens surfaces and non-lens surfaces facing different directions from each other;

forming a primary film on each lens surface by depositing a material of said primary film only on said lens surfaces;

forming an invalid light absorbing film for restraining transmission of light on said lens surfaces and said non-lens surfaces;

removing said primary film and the invalid light absorbing film from said lens surfaces;

selecting the material of said primary film from the group consisting of iron oxides, Si and Ti;

the material of said invalid light absorbing film being selected from the group consisting of metal, oxide, carbon, sublimation pigment, and sublimation dye; and the material of said primary film and the material of said invalid light absorbing film being soluble in different types of solvents.

16. A method for fabricating a Fresnel lens having a lens main body for converging light passed through a lens surface comprising the steps of:

preparing the Fresnel lens main body with a plurality of prisms having lens surfaces and non-lens surfaces facing different directions from each other;

forming a primary film on each lens surface by depositing a material of said primary film only on said lens surfaces;

forming an invalid light absorbing film for restraining transmission of light on said lens surfaces and said non-lens surfaces;

removing said primary film and the invalid light absorbing film from said lens surfaces;

the material of said primary film being selected from the group consisting of aluminum metal;

the material of said invalid light absorbing film being selected from the group consisting of sublimation pigment, sublimation dye, metal, oxide and carbon, said metal, oxide and carbon being insoluble in alkaline solvents;

the material of said primary film and the material of said invalid light absorbing film being soluble in different types of solvents; and said primary film being caused to dissolve in said alkaline solvents in the step of removing said primary film from said lens surfaces.

* * * * *